(12) United States Patent
Sundaram (10) Patent No.: US 7,480,364 B2
(45) Date of Patent: Jan. 20, 2009

(54) HIGH VOLTAGE TANK ASSEMBLY FOR RADIATION GENERATOR

(75) Inventor: Senthil Kumar Sundaram, Navi Mumbai (IN)

(73) Assignee: General Electric Company, Schenectady, NY (US)

( * ) Notice: Subject to any disclaimer, the term of this patent is extended or adjusted under 35 U.S.C. 154(b) by 263 days.

(21) Appl. No.: 11/556,482

(22) Filed: Nov. 3, 2006

(65) Prior Publication Data

US 2008/0107235 A1 May 8, 2008

(51) Int. Cl.
*H05G 1/12* (2006.01)
*H05K 1/18* (2006.01)

(52) U.S. Cl. .................. 378/104; 361/756; 361/763

(58) Field of Classification Search ............. 378/101, 378/104; 361/756, 762, 763
See application file for complete search history.

(56) References Cited

U.S. PATENT DOCUMENTS

| | | | |
|---|---|---|---|
| 5,079,069 A | 1/1992 | Howard et al. | |
| 5,162,977 A | 11/1992 | Paurus et al. | |
| 5,166,965 A * | 11/1992 | Collier | 378/101 |
| 5,774,349 A * | 6/1998 | Tichy et al. | 378/104 |
| 6,563,056 B1 | 5/2003 | Belwon et al. | |
| 6,812,410 B2 * | 11/2004 | Sakamoto et al. | 361/760 |
| 6,891,276 B1 * | 5/2005 | Chiang | 257/790 |
| 7,205,483 B2 * | 4/2007 | Yamashita et al. | 361/749 |
| 7,400,515 B2 * | 7/2008 | Sakamoto et al. | 361/803 |
| 2001/0010627 A1 * | 8/2001 | Akagawa | 361/761 |
| 2006/0109033 A1 | 5/2006 | Sundaram | |

* cited by examiner

*Primary Examiner*—Chih-Cheng G Kao (57) ABSTRACT

A radiation generator comprising a radiation source, a high voltage tank assembly to energize the radiation source and a power circuit configured to supply alternating current (AC) power to the high voltage tank assembly is provided. The high voltage tank assembly comprises a voltage multiplier assembly configured to include a printed circuit board comprising multiple slots, plurality of electrical components configured to be mounted on the printed circuit board and at least one insulating cover with multiple projections configured to be placed on one of the first surface and the second surface of the printed circuit board. Further, the projections of the insulating cover are configured to fit into the slots of the printed circuit board. The projections when fitted into the slots provide insulation barrier to the electrical components mounted on the printed circuit board.

19 Claims, 9 Drawing Sheets

HIGH VOLTAGE TANK ASSEMBLY FOR RADIATION GENERATOR

BACKGROUND OF THE INVENTION

The subject matter described herein generally relates to a radiation generator and more particularly to a high voltage tank assembly used in a radiation generator.

An imaging system typically comprises a radiation generator and a radiation detector. Generally, the radiation generators are bulky and possess a heavy weight. In some imaging systems, the radiation generator may be balanced with counter weights at the radiation detector to maintain the center of gravity. Alternatively, the radiation generator may be configured to rotate around an object at a speed of several revolutions per second. Therefore, it is desirable to realize a compact radiation generator, in order to avoid adding counterweights and to increase the speed of rotation of the radiation generator. The radiation generator generally comprises a radiation source, a high voltage tank assembly configured to energize the radiation source and a power circuit. As the high voltage tank assembly is responsible for generating the high voltage required for operation of the radiation source and represents a substantial part of the overall size of the radiation generator, it is desirable to provide a compact high voltage tank assembly.

The high voltage tank assembly generally houses a voltage multiplier assembly and a transformer assembly. The voltage potential needed to generate radiation within the radiation source is provided with the help of the voltage multiplier assembly. An alternating current (AC) voltage from the power circuit is fed to the voltage multiplier assembly as an input. The voltage multiplier assembly generally comprises multiple multiplier stages configured to rectify and multiply the applied AC voltage depending on the number of the multiplier stages present.

Each multiplier stage comprises multiple diodes and multiple capacitors. It is desirable to use less number of diodes and capacitors used to form the multiplier stage. Each diode is characterized by a peak inverse voltage (PIV) value. The number of components used in each multiplier stage and the number of multiplier stages used to generate the required high voltage is dependent on the PIV of each diode used in the multiplier stage. A diode with a high value of PIV reduces the number of components and the number of stages required to obtain the desired high voltage. Typically, each multiplier stage uses diodes of PIV value in order of tens of kV. However, using such diodes may not be the cost effective design.

Another known method of manufacturing the voltage multiplier assembly uses diodes with a PIV rating of 1 kV. Multiple diodes with the PIV rating of 1 kV can be connected in series to effectively produce the require PIV for the multiplier stage. The number of diodes used in the voltage multiplier assembly increases multiple folds with the substitution. A drawback of using the diodes with a PIV rating of 1 kV is the difficulty in packing a large number of diodes in a limited space to provide a high voltage supply for the radiation source.

Another drawback of using diodes connected in series is, an existence of unequal distribution of voltage across each diode during transient conditions such as a single shot power turn ON and a high voltage arcing. The voltage distribution under transient conditions is generally influenced by stray capacitances in the voltage multiplier assembly and can lead to unequal distribution of the voltage across the diode arranged in series and thereby results in violation of the PIV rating of the diode.

Generally, the high voltage generated in the radiation source is usually measured with a high voltage component such as, a high voltage resistor divider. The high voltage resistor divider usually has a substantially long structure to ensure sufficient insulation on the surface. The high voltage resistor divider typically comprises a long structure with a high electrical potential at one end and a near ground electrical potential at the other end, thereby creating a non-uniform electric field distribution along the length of the high voltage resistor divider. The non-uniform distribution of electrical potential along the length of the high voltage resistor divider affects the divider ratio during transient conditions and thereby the response and accuracy of measurement.

Further, multiple shields at definite electrical potentials are provided around the high voltage resistor divider to regulate the stray capacitance. The length of the high voltage resistor divider and the shields provided around the high voltage resistor divider make the high voltage resistor divider bulky and voluminous.

Hence, there exists a need to provide a compact and efficient design for assembling various components of a high voltage tank assembly used in the radiation generator.

BRIEF DESCRIPTION OF THE INVENTION

The above-mentioned shortcomings, disadvantages and problems are addressed herein which will be understood by reading and understanding the following specification.

In one embodiment, a radiation generator comprising a radiation source, a high voltage tank assembly configured to energize the radiation source and a power circuit configured to supply AC power to the high voltage tank assembly is provided. The high voltage tank assembly comprises a voltage multiplier assembly configured to include a printed circuit board, plurality of electrical components configured to be mounted on the printed circuit board and at least one insulating cover configured to enclose the printed circuit board. The printed circuit board comprises multiple slots and the insulating cover comprises multiple projections configured to fit into the slots. The projections when fitted into the slots provide insulation barrier to the electrical components mounted on the printed circuit board.

In another embodiment, a high voltage tank assembly for a radiation generator is provided. The high voltage tank assembly comprises a voltage multiplier assembly and a transformer assembly coupled to the voltage multiplier assembly. The voltage multiplier assembly comprises a printed circuit board with multiple slots, plurality of electrical components configured to be mounted on the printed circuit board and at least one insulating cover configured to enclose the printed circuit board. Further, the insulating cover comprises a plurality of projections capable of being fitted into the slots thereby providing an insulation barrier to one or more electrical components.

In yet another embodiment, a voltage multiplier assembly for a radiation generator is provided. The voltage multiplier assembly comprises a printed circuit board with multiple slots, plurality of electrical components and at least one insulating cover configured to enclose the printed circuit board. The printed circuit board comprises a first layer, a second layer and a capacitive core element disposed in parallel relation between the first layer and the second layer. Further, the electrical components are configured to be mounted on at least one of the first layer and the second layer of the printed circuit board. The insulating cover comprises plurality of projections capable of being fitted into the slots of the printed circuit board. The projections when fitted into the slots provide insulation barrier to one or more electrical components mounted on the printed circuit board.

Systems and methods of varying scope are described herein. In addition to the aspects and advantages described in this summary, further aspects and advantages will become apparent by reference to the drawings and with reference to the detailed description that follows.

DETAILED DESCRIPTION OF THE INVENTION

In the following detailed description, reference is made to the accompanying drawings that form a part hereof, and in which is shown by way of illustration specific embodiments, which may be practiced. These embodiments are described in sufficient detail to enable those skilled in the art to practice the embodiments, and it is to be understood that other embodiments may be utilized and that logical, mechanical, electrical and other changes may be made without departing from the scope of the embodiments. The following detailed description is, therefore, not to be taken in a limiting sense.

The invention may take form in various components and arrangements of components. The drawings are only for purposes of illustrating various embodiments and are not to be construed as limiting the invention.

An imaging apparatus such as a computed tomography (CT) apparatus and an X-ray apparatus, configured to image objects, comprises a radiation generator, a radiation detector and a data acquisition system. The radiation generator generates electromagnetic radiation for projection towards the object to be scanned. The electromagnetic radiation may include X-rays, gamma rays and other high frequency (HF) electromagnetic energy. The X-rays incident on the object being scanned are attenuated by the object. The radiation detector comprises multiple detector elements for converting the attenuated X-rays into electrical signals. The electrical signals so formed are named as projection data. The data acquisition system samples the projection data from the detector elements and converts the projection data into digital signals for computer processing.

Figure 1:
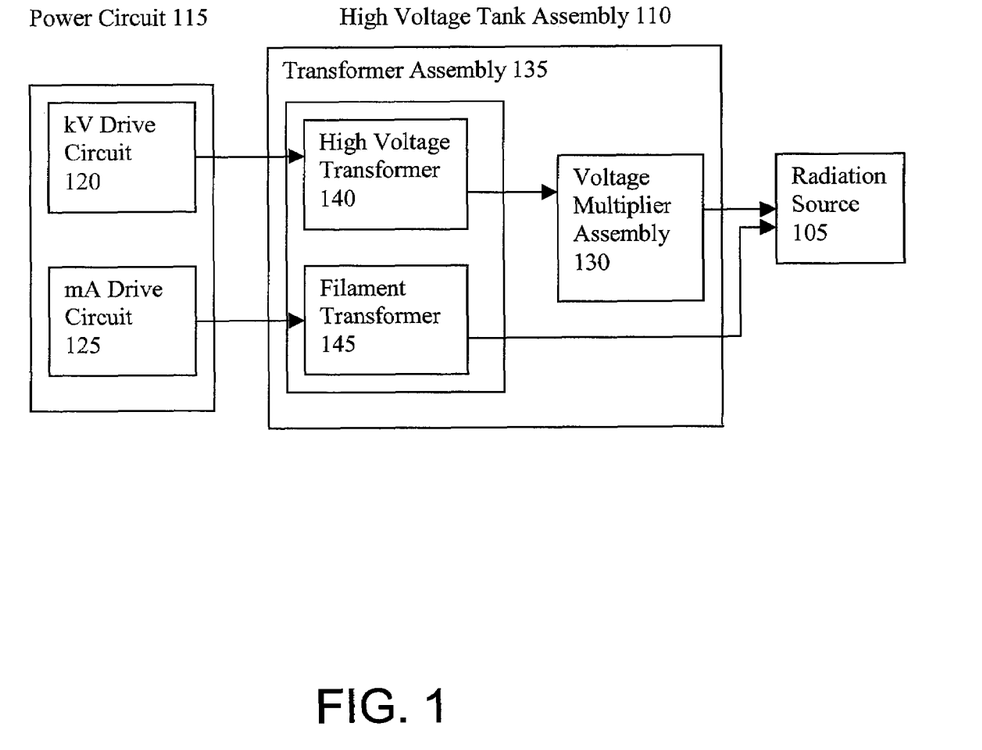
FIG. 1 shows a block diagram of an exemplary embodiment of a radiation generator.

FIG. 1 shows an exemplary embodiment of a radiation generator 100 that typically includes a radiation source 105 configured to create an emission of electromagnetic radiation, a high voltage tank assembly 110 electrically coupled to energize the radiation source 105 so as to generate the electromagnetic radiation, and a power circuit 115 operationally coupled to the high voltage tank assembly 110.

Figure 2:
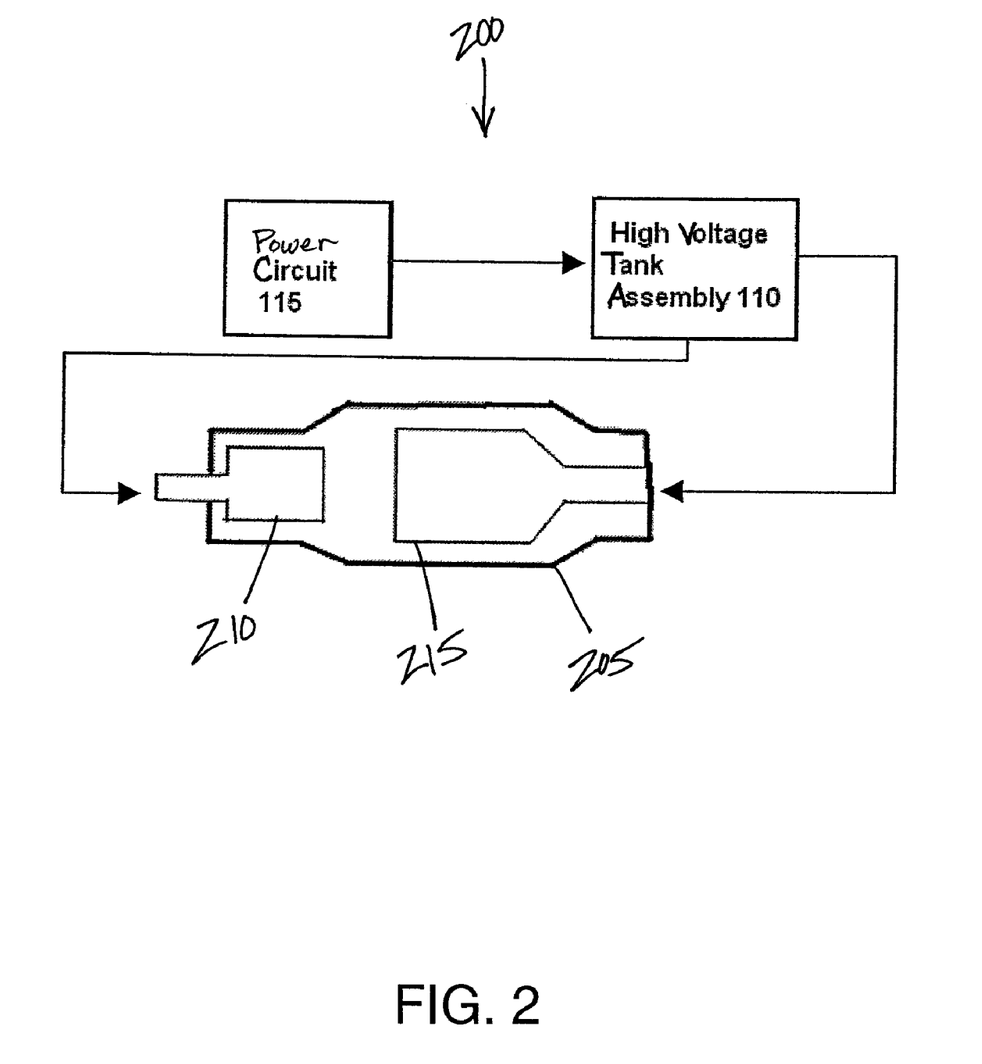
FIG. 2 shows a schematic diagram of an exemplary embodiment of an X-ray generator.

FIG. 2 shows an exemplary embodiment of the radiation generator 100 shown in FIG. 1. In the illustrated embodiment of FIG. 2, the radiation generator 100 is an X-ray generator 200 and the radiation source 105 is an X-ray tube 205 electrically coupled in a conventional manner to the high voltage tank assembly 110 so as to create an emission of X-rays. The illustrated X-ray tube 205 generally includes a cathode 210 located opposite an anode 215 in general alignment along a longitudinal axis of the X-ray tube 205. The cathode 210 includes an electron-emitting filament that is capable in a conventional manner of emitting electrons. The high voltage potential supplied by the high voltage tank assembly 110 causes acceleration of the electrons from the cathode 210 towards the anode 215. The accelerated electrons collide with the anode 215, producing electromagnetic radiation, including X-ray radiation.

The elements, which are the same as or correspond to elements of FIG. 1, are denoted by the same reference numerals, so that in this sense the description need not be repeated and only the differences will be dealt with.

The high voltage tank assembly 110 provides the necessary voltage potential needed to generate X-rays within the X-ray tube 205. An external input power source (not shown) is coupled to the radiation generator 100. The power circuit 115 houses circuitry necessary to convert the power from the external input power source to voltages needed to drive and regulate the high voltage tank assembly 110. The power circuit 115 comprises two principal power sections; a kV drive circuit 120 and a mA drive circuit 125 (see FIG. 1). The kV drive circuit 120 provides power to the high voltage tank assembly 110 to enable the high voltage tank assembly 110 to develop the high voltage potentials necessary to generate X-rays. The mA drive circuit 125 provides power to the X-ray tube filament for heating the filament so as to emit electrons. The mA drive circuit 125 allows control of the number of electrons boiled off by the filament, and thus provides control of the tube current flow. The power circuit 115 also houses a plurality of low voltage power supplies, which are used to furnish biasing voltages to the internal circuitry within the power circuit 115.

The input to the power circuit 115 is generally a direct current (DC) voltage. However, when the input voltage is an AC voltage, the AC voltage is rectified and then applied to the power circuit 115. Accordingly, the radiation generator 100 may further comprise a line rectifier (not shown) configured to provide DC voltage to the power circuit 115. An input line power is supplied to the line rectifier (not shown), which converts AC voltage to an unregulated DC voltage. The unregulated DC voltage from the line rectifier (not shown) is applied to the kV drive circuit 120 and the mA drive circuit 125.

The high voltage tank assembly 110 is designed to receive an AC waveform from the power circuit and condition the AC waveform to provide a high voltage DC potential to the double-pole supply of the X-ray tube 205 where the anode 215 and the cathode 210 carry equal voltages of different polarity. The high voltage tank assembly 110 comprises a voltage multiplier assembly 130 and a transformer assembly 135 coupled to the voltage multiplier assembly 130 (shown at FIG. 1). The voltage multiplier assembly 130 configured to provide the high voltage DC power supply comprises a cathode multiplier and an anode multiplier. The transformer assembly 135 coupled to the voltage multiplier assembly 130 comprises a high voltage transformer 140 and a filament transformer 145 (shown at FIG. 1). The transformer assembly 135 and the voltage multiplier assembly 130 of the high voltage tank assembly 110 condition the AC voltage signal transferred by the power circuit 115.

The AC voltage from the kV drive circuit 120 is applied to the primary winding of the high voltage transformer 140 within the high voltage tank assembly 110. The high voltage transformer 140 increases the amplitude of the AC square wave voltage at the secondary winding. The high voltage AC signal is applied in turn to the voltage multiplier assembly 130. The voltage multiplier assembly 130 comprises a plurality of serially connected voltage multiplying-rectifying stages having a low voltage potential end and a high voltage potential end. The low voltage potential end is connected to the secondary winding of the high voltage transformer 140 and the high voltage potential end is connected to the tube electrodes 210 and 215 of the X-ray tube 205.

The voltage multiplier assembly 130 converts the AC signal to two equal DC voltages of different polarities and increases the voltage level. The DC voltage is then applied to the tube electrodes 210 and 215 of the X-ray tube 205. In order to carry out the function of multiplying and rectifying, the voltage multiplier assembly 130 comprises multiple electrical components. The non-limiting examples of the electrical components include resistors, capacitors and diodes.

In parallel with the multiple-stage voltage multiplier assembly 130 is the filament transformer 145 producing AC filament heating output currents for the X-ray tube filament. The AC voltage generated by the mA drive circuit 125 is applied to the input of the filament transformer 145. The filament transformer 145 provides voltages appropriate for driving the X-ray tube filaments.

A small portion of the X-ray tube current from the X-ray tube filament is fed back to the mA drive circuit 125 by a mA feedback conductor and is continually compared to the setting on a mA controller. Further, a small portion of the kV potential generated in the voltage multiplier assembly 130 is fed to the kV drive circuit 120 by a kV feedback conductor so as to allow continual comparison to the setting on a kV controller.

A high voltage component such as a high voltage resistor divider furnishes the feedback voltage at the kV feedback conductor, which is one of the inputs to the kV drive circuit 120 of the power circuit 115. The high voltage component also performs an additional function of discharging multiple capacitors used in the voltage multiplier assembly 130. The high voltage component includes at least one high voltage resistor divider having a resistance value in the range of hundreds of mega ohms. However, the resistance value of the high voltage resistor divider may vary.

Figure 3:
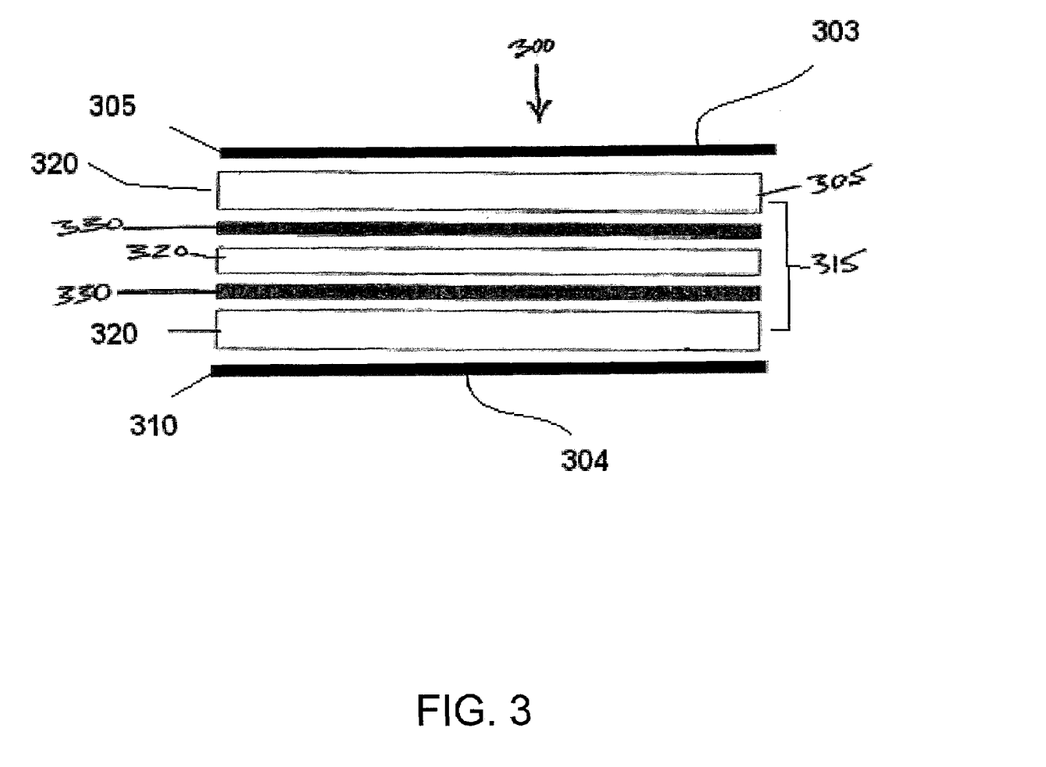
FIG. 3 shows an exploded side view schematic diagram of an exemplary embodiment of a printed circuit board.

In an exemplary embodiment, the voltage multiplier assembly 130 comprises a printed circuit board and at least one insulating cover configured to enclose the printed circuit board. FIG. 3 shows an exploded side view schematic diagram of an exemplary embodiment of the printed circuit board 300. The insulating cover (not shown) is designed to enclose the printed circuit board 300 and may comprise two members, a first member placed around a first outer surface 303 of the printed circuit board 300, and a second member placed around a second outer surface 304 of the printed circuit board 300.

The printed circuit board 300 may comprise multiple layers such as a first outer layer 305 and a second outer layer 310. Further, the printed circuit board 300 may comprise a plurality of inner layers comprising a multi-layer capacitive core element 315 sandwiched between the two outer layers namely the first outer layer 305 and the second outer layer 310 of the printed circuit board 300. The first outer layer 305 and the second outer layer 310 can be bound to the capacitive core element 315 using various processes, such as mechanical pressing, heating, pressurized spray, adhesives, or other conventional processes or combination thereof.

The capacitive core element 315 comprises at least one dielectric medium 320 of material having a high dielectric constant, and at least two planes 330 of electrically conductive material. Further, each electrically conductive plane 330 of the printed circuit board 300 can comprise multiple layers of electrically conductive material.

The high dielectric constant material is typically a resin/epoxy material with added high dielectric constant filler. Each dielectric medium 320 is constructed from a composition selected from a group consisting of an epoxy, a urethane and a silicon-potting compound. Although FIG. 3 shows the capacitive core element 315 of the printed circuit board 300 having two electrically conductive planes 330, and three dielectric mediums 320, it is understood that the number of the electrically conductive planes and the dielectric mediums can vary.

Although a single printed circuit board 300 is referenced and illustrated having the capacitive core element 315, it is understood that the voltage multiplier assembly 130 may be comprised of multiple printed circuit boards each having a capacitive core element 315 comprising multiple dielectric mediums 320, and multiple electrically conductive planes 330, similar to the construction of the printed circuit board 300 described above.

In an exemplary embodiment, the at least two electrically conductive planes 330 of the printed circuit board 300 may separate the first outer layer 305, the dielectric medium 320, and the second outer layer 310. The first outer layer 305 and the second outer layer 310 of the printed circuit board 300 and each electrically conductive plane 330 may comprise one of a metal, a compound of a metal (such as a metal oxide, metal phosphate and metal sulphate), and an alloy of a metal or combination thereof. The metal can be selected from a group consisting of tungsten, calcium, tantalum, tin, molybdenum, brass, copper, strontium, chromium, aluminum and bismuth. However, it is understood that the composition of the first outer layer 305, the second outer layer 310, the capacitive core element 315, the at least one dielectric medium 320, and the electrically conductive planes 330 of the printed circuit board 300 are not limited to the examples given above.

The voltage multiplier assembly 130 generally comprises at least one printed circuit board 300 and multiple electrical components (not shown) electrically connected as part of the voltage multiplier assembly 130 communicating a high voltage potential to the radiation source 105 of the radiation generator 100. The electrical components (not shown) may include one or more of resistors, diodes and capacitors. One skilled in the art shall however appreciate that the examples of the electrical components used in the voltage multiplier assembly 130 are not limited to the examples given above and the invention shall have full scope of the claims.

Figure 4A:
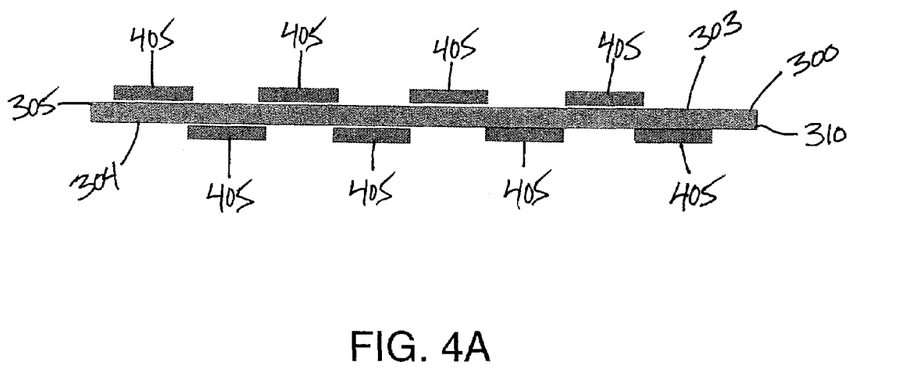
FIG. 4A shows a side view schematic diagram of another exemplary embodiment of a portion of a printed circuit board.
Figure 4B:
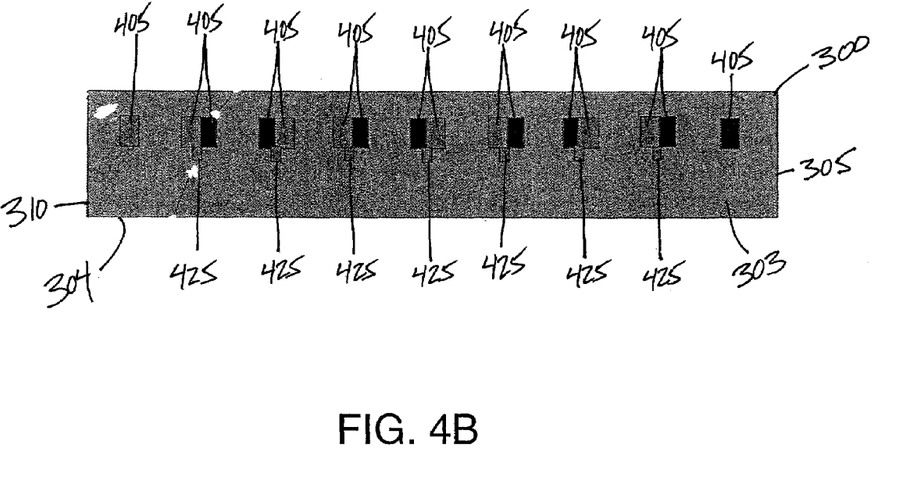
FIG. 4B shows a top view schematic diagram of another exemplary embodiment of a portion of a printed circuit board, illustrating components on the top and bottom surfaces of the printed circuit board.

In an exemplary embodiment, in order to overcome the constraint in the dimension for packaging the components of the voltage multiplier assembly 130, the diodes can be selected to be surface mount devices (SMD). One advantage of the using SMDs is the possibility of mounting the diodes on the outer surface 303 of the first outer layer 305 and on the outer surface 304 of the second outer layer 310 of the printed circuit board 300. FIG. 4A illustrates a side view schematic diagram of another exemplary embodiment of a portion of the printed circuit board 300 with a plurality of SMD diodes 405 mounted on the first outer surface 303 of the first outer layer 305 and the second outer surface 304 of the second outer layer 310 of the printed circuit board 300, using standard printed circuit board assembly technology. FIG. 4B shows a top view schematic diagram of another exemplary embodiment of a portion of the printed circuit board 300, illustrating a plurality of SMD diodes 405 mounted on the outer surface 303 of the first outer layer 305 and the outer surface 304 of the second outer layer 310 of the printed circuit board 300.

In an exemplary embodiment, the diodes 405 can be mounted on the printed circuit board 300 using a soldering process. A solder pad can be provided for each of the diodes 405 on which the diodes 405 can be soldered. A pair of vertically adjacent diodes 405 are each placed on one surface of the printed circuit board 300 (a diode placed on the outer surface 303 of the first outer layer 305 and a diode placed on the outer surface 304 of the second outer layer 310) can be electrically connected via a plated-through-hole (PTH) 425. The PTH 425 can be placed at a reasonable distance from the solder pad to avoid complications during the soldering process for mounting the diodes 405 on the printed circuit board 300. The capacitive core element 315 of the printed circuit board 300 can be interconnected with the diodes 405 mounted on the outer surface 303 of the first outer layer 305 and the outer surface 304 of the second outer layer 310 of the printed circuit board 300, as shown in FIG. 4B.

Locating the diodes 405 on the two outer surfaces 303 and 304 of the printed circuit board 300 provides an advantage for mounting other electrical components (not shown), such as capacitors and resistors, between two diodes. For example, when a diode 405 is placed on the outer surface 303 of the first outer layer 305 of the printed circuit board 300, the electrical components (not shown) can be soldered opposite the diode 405 on the outer surface 304 of the second outer layer 310 of the printed circuit board 300 and vice versa. Placing the electrical components (not shown) on the opposite surface to the surface of the placement of the diode is easier due to the availability of the PTH 425 and provision for fabrication of the solder pad on the printed circuit board 300. In an alternative embodiment, the electrical components (not shown) may be placed on top of each diode and thus, soldered across the tops of the diodes.

Figure 5A:
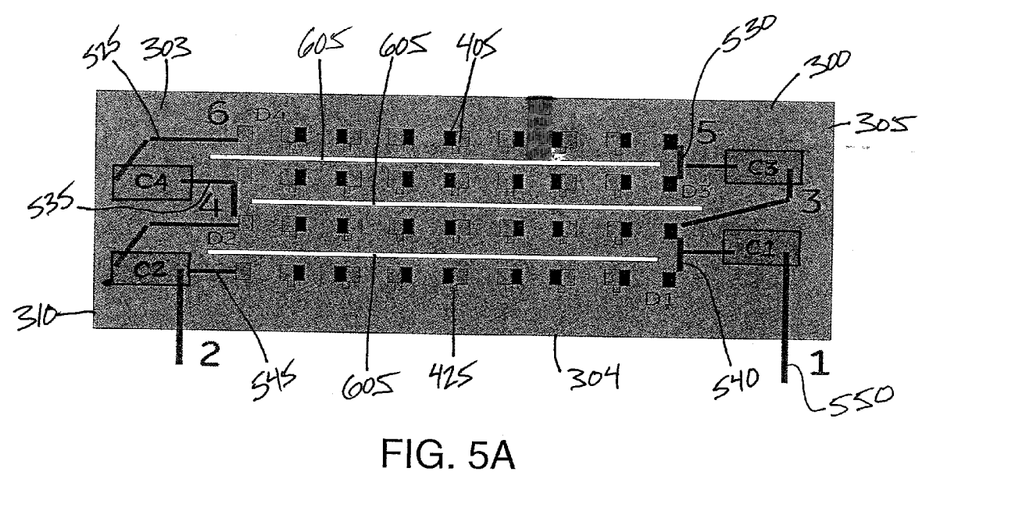
FIG. 5A shows a top view schematic diagram of another exemplary embodiment of a portion of a printed circuit board, illustrating components on the top and bottom surfaces of the printed circuit board.
Figure 5B:
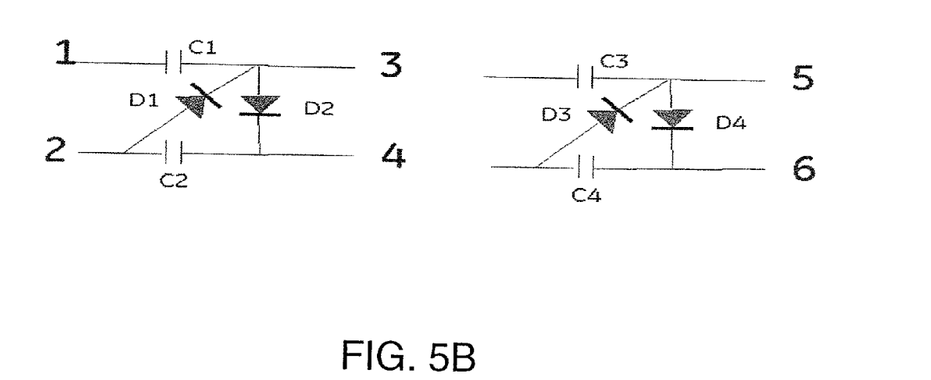
FIG. 5B shows a schematic representation of the circuitry on the printed circuit board of FIG. 5A.

FIG. 5A shows a top view schematic diagram of another exemplary embodiment of a larger portion of the printed circuit board 300, illustrating a plurality of diodes 405 mounted on the outer surface 303 of the first outer layer 305 and the outer surface 304 of the second outer layer 310 of the printed circuit board 300. FIG. 5B shows a schematic representation of the circuitry on the printed circuit board 300 shown at FIG. 5A. Multiple pairs of diodes 405 are arranged in a single line and are electrically connected to each other by the PTH 425 to form a diode series D1, D2, D3 and D4. Each diode series D1, D2, D3 and D4 comprises two end terminals located on each end of the diode series D1, D2, D3 and D4. For example, the diode series D1 comprises two end terminals 545(2) and 540(3), the diode series D2 comprises two end terminals 540(3) and 535(4), the diode series D3 comprises two end terminals 535(4) and 530(5) and the diode series D4 comprises two end terminals 530(5) and 525(6).

Figure 6A:
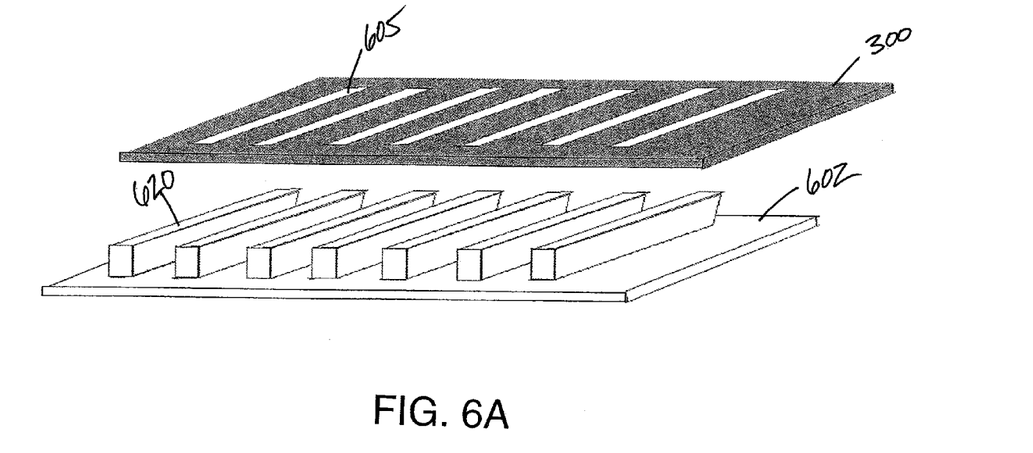
FIG. 6A shows an exploded perspective view schematic diagram of an exemplary embodiment of a printed circuit board and an insulating cover assembly.

The diode series D1, D2, D3 and D4 are connected in a zigzag manner. The diode series D1 is connected to diode series D2 at end terminal 540(3). The diode series D2 is connected to diode series D3 at end terminal 535(4). The diode series D3 is connected to diode series D4 at the end terminal 530(5). Two adjacent diode series have varying magnitude of electrical stress. The electrical stress is comparatively low at the points 530, 535 and 540 connecting the diode series D1, D2, D3 and D4. However, the electrical stress is relatively high between the diode series D1 and D4 not connected at the end terminals 545(2) and 525(6). For realizing a compact voltage multiplier assembly, a uniform electrical stress is to be maintained through the provision of an insulation barrier resulting from a plurality of slots 605 extending through printed circuit board 300, which is further explained in conjunction with FIG. 6.

The placement of diodes 405 on the outer surface 303 of the first outer layer 305 and the outer surface 304 of the second outer layer 310 of the printed circuit board 300 allows having the end terminals 545(2) and 540(3), 540(3) and 535(4), 535(4) and 530(5), 530(5) and 525(6) of the diode series D1, D2, D3 and D4 located on either surface 303 and 304 of the printed circuit board 300.

In an exemplary embodiment, multiple capacitors C1, C2, C3 and C4 used in the voltage multiplier assembly 130 can be soldered between the end terminals 550(1) and 540(3), 545(2) and 535(4), 540(3) and 530(5), 535(4) and 525(6) of the diode series D1, D2, D3 and D4. For example, the capacitor C1 can be soldered between end terminals 550(1) and 540(3), the capacitor C2 can be soldered between end terminals 545(2) and 535(4), the capacitor C3 can be soldered between end terminals 540(3) and 530(5), the capacitor C4 can be soldered between end terminals 535(4) and 525(6), as illustrated in FIGS. 5A and 5B. Further, a high voltage component (not shown) can be placed between the solder terminals of the capacitors C1, C2, C3 and C4. This configuration enables the electrical potential at specific locations along the length of the high voltage component (not shown), to become substantially equal to the electrical potentials of the capacitor C1, C2, C3 or C4 located at the specific location, thereby producing a substantially linear voltage distribution (grading) along the length of the high voltage component (not shown). This is further explained in conjunction with FIG. 8.

In an exemplary embodiment, the placement of the high voltage component (not shown) such as a high voltage resistor divider between the capacitor terminals results in a definite grading of voltage along the length of the high voltage resistor divider. Moreover, the placement of the high voltage resistor divider between the capacitor terminals results in a compact design for the high voltage tank assembly 110. The capacitors C1, C2, C3 and C4 may be mounted on one surface of the printed circuit board 300 (for example, outer surface 303) and the high voltage resistor divider may be mounted on the opposite surface (for example, outer surface 304) of the printed circuit board 300. Further, the outer surface 303 of the first outer layer 305 can be a component surface configured to enable the placement of the electrical components (not shown) and the outer surface 304 of the second outer layer 310 can be a solder surface for the electrical components (not shown) placed on the outer surface 303 of the first outer layer 305. The high voltage resistor divider can be placed between the solder pads of the capacitors C1, C2, C3 and C4, consequently upon mounting the capacitors C1, C2, C3 and C4.

In a continued effort in providing a compact high voltage tank assembly 110, the design of the printed circuit board 300 is further made compact by providing grooves and/or slots in the printed circuit board 300 to obtain a predetermined creepage. A plurality of slots 605 extending through the printed circuit board 300 and located between the diode series D1, D2, D3 and D4 are shown in FIG. 5A.

Figure 6B:
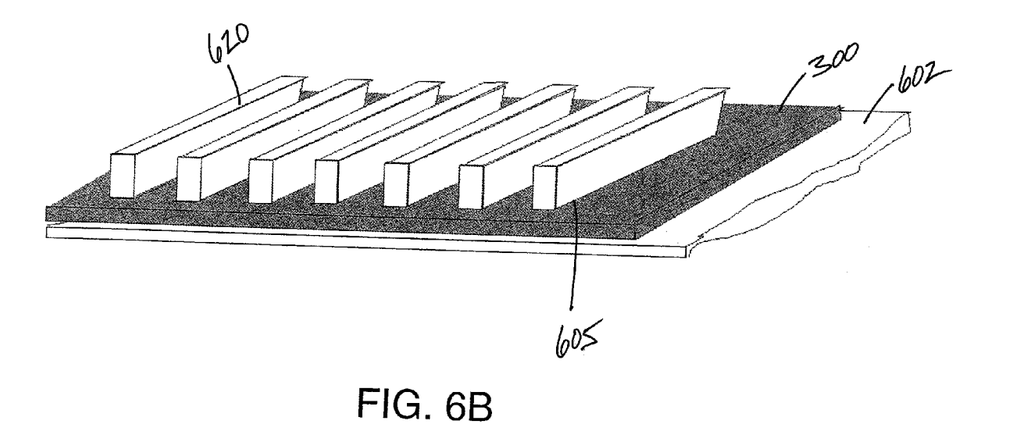
FIG. 6B shows a perspective view schematic diagram of the printed circuit board mounted on the insulating cover assembly of FIG. 6A.

FIG. 6A shows an exploded perspective view schematic diagram of an exemplary embodiment of a printed circuit board 300 and an insulating cover assembly 602. FIG. 6B shows a perspective view schematic diagram of the printed circuit board 300 mounted on the insulating cover assembly 602. The printed circuit board 300 includes a plurality of slots 605 extending through the printed circuit board 300. The clearance issues resulting from the close proximity of the diodes 405 placed on the printed circuit board 300, adding to the high packing density of the electrical components (not shown) mounted on the printed circuit board 300 are addressed by providing an insulation barrier to improve the insulation between the diode series D1, D2, D3 and D4, and between the end terminals 545(2) and 540(3), 540(3) and 535(4), 535(4) and 530(5), 530(5) and 525(6) of the diode series D1, D2, D3 and D4 having high electrical stress. The insulation barriers can be provided through the insulating cover assembly 602 used for enclosing the printed circuit board 300. The insulating cover assembly 602 includes a plurality of projections 620 extending outwardly from at least one surface of the insulating cover assembly 602 and are formed during the molding of the insulating cover assembly 602. The projections 620 are configured to fit through the slots 605 extending through the printed circuit board 300 to provide an insulation barrier between the plurality of diode series D1, D2, D3 and D4 mounted on the printed circuit board 300.

In an exemplary embodiment, the voltage multiplier assembly 130 can comprise multiple insulating covers configured to be placed on at least one of the outer surface 303 of the first outer layer 305 and the outer surface 304 of the second outer layer 310 of the printed circuit board 300. At least one of the insulating covers can be configured to comprise multiple projections 620. The at least one insulating cover when placed adjacent to the printed circuit board 300 such that the projections 620 fit through the slots 605 of the printed circuit board 300, the projections 620 provide an insulation barrier to the electrical components (not shown) mounted on the printed circuit board 300.

The insulating cover assembly 602 is comprised of at least one polymeric material selected from the group consisting of thermoplastic elastomers, polypropylene, polyethylene, polyamide, polyethylene terephtalate, polybutylene terephtalate, polycarbonate, polyphenylene oxide, and blends of polypropylene, polyethylene, polyamide, polyethylene terephtalate, polybutylene terephtalate, polycarbonate, and polyphenylene oxide.

Referring again to FIG. 3, in an exemplary embodiment, the at least two electrically conductive planes 330 separating at least one dielectric medium 320 of the printed circuit board 300 can be configured so as to be able to maintain a voltage potential that is different from one another and/or from the electrical ground. The at least two electrically conductive planes 330 and the at least one dielectric medium 320 maintained at different voltage potentials, can be employed to provide a fixed capacitance at a desired location on the printed circuit board 300. During transient conditions, the fixed capacitance provided at the desired location enables a substantially uniform distribution of voltage across the electrical component placed at the desired location.

Figure 7A:
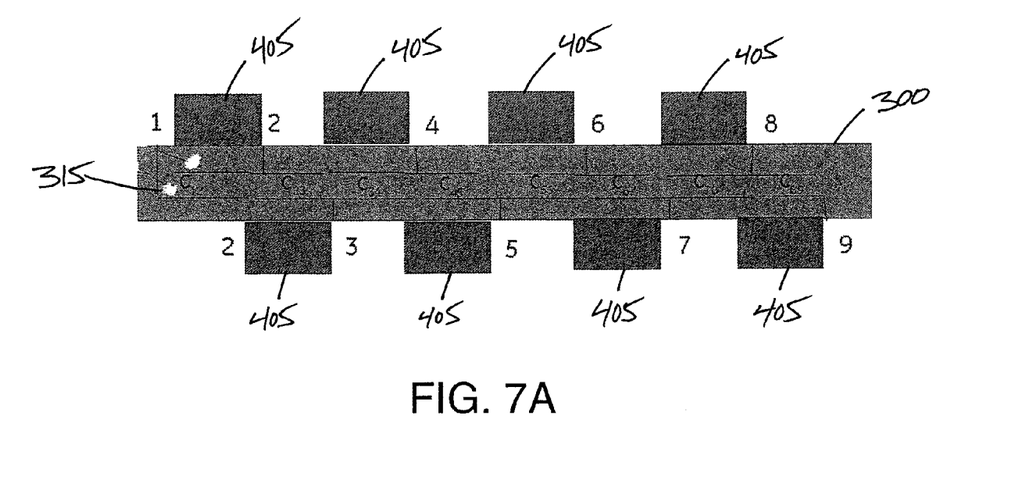
FIG. 7A shows a side view schematic diagram of yet another embodiment of a printed circuit board.
Figure 7B:
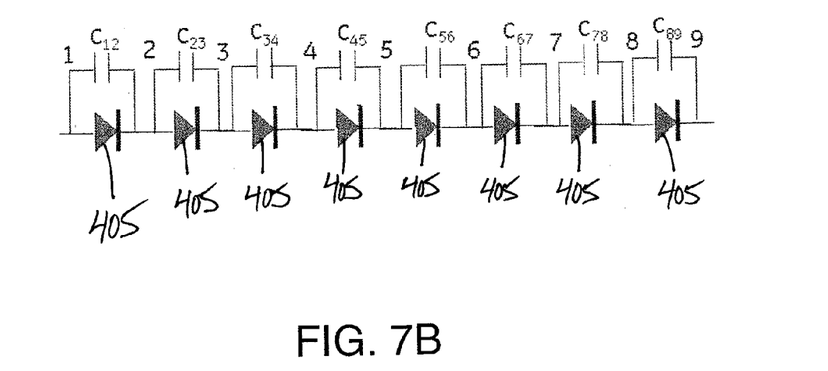
FIG. 7B shows a schematic representation of the circuitry of the printed circuit board of FIG. 7A.

In an exemplary embodiment, the at least two electrically conductive planes 330 and the at least one dielectric medium 320 of the printed circuit board 300 can be employed to provide a fixed capacitance across at least one electrical component such as a diode 405 mounted on the printed circuit board 300 (see FIG. 4A). FIG. 7A shows a side view schematic diagram of yet another embodiment of a printed circuit board 300 employing the at least two electrically conductive planes 330 and the at least one dielectric medium 320 to provide multiple fixed capacitances $C_{12}$, $C_{23}$, $C_{34}$, $C_{45}$, $C_{56}$, $C_{67}$, $C_{78}$ and $C_{89}$ across the diode 405. During transient conditions, the stray capacitances causing an unequal distribution of the voltage among the diodes 405 in the diode series D1, D2, D3 and D4 can be made insignificant by introducing the fixed capacitances $C_{12}$, $C_{23}$, $C_{34}$, $C_{45}$, $C_{56}$, $C_{67}$, $C_{78}$ and $C_{89}$. The fixed capacitances $C_{12}$, $C_{23}$, $C_{34}$, $C_{45}$, $C_{56}$, $C_{67}$, $C_{78}$ and $C_{89}$ provided by the capacitive core element 315 of the multiple layer printed circuit board 300 enables a substantially uniform distribution of voltage across the diodes 405 in the diode series D1, D2, D3 and D4. FIG. 7B shows a schematic representation of the circuitry of the printed circuit board 300 shown at FIG. 7A.

In an exemplary embodiment, the capacitive core element 315 may typically exhibit a capacitance of 0.1 microfarads per square inch. Thus, using two or more dielectric mediums 320 with a predetermined tolerance can provide a capacitance in the range of 10 pF to 20 pF. A printed circuit board comprising a capacitive core element with such capacitance characteristics obviates the need for the fixed capacitors used in regulating the stray capacitance across multiple electrical components (not shown) mounted externally on the printed circuit board 300. The insulation between the fixed capacitors $C_{12}$, $C_{23}$, $C_{34}$, $C_{45}$, $C_{56}$, $C_{67}$, $C_{78}$ and $C_{89}$ formed by using the capacitive core element 315 of the printed circuit board 300 can be taken care as the voltage levels are in the range of kV.

Figure 8:
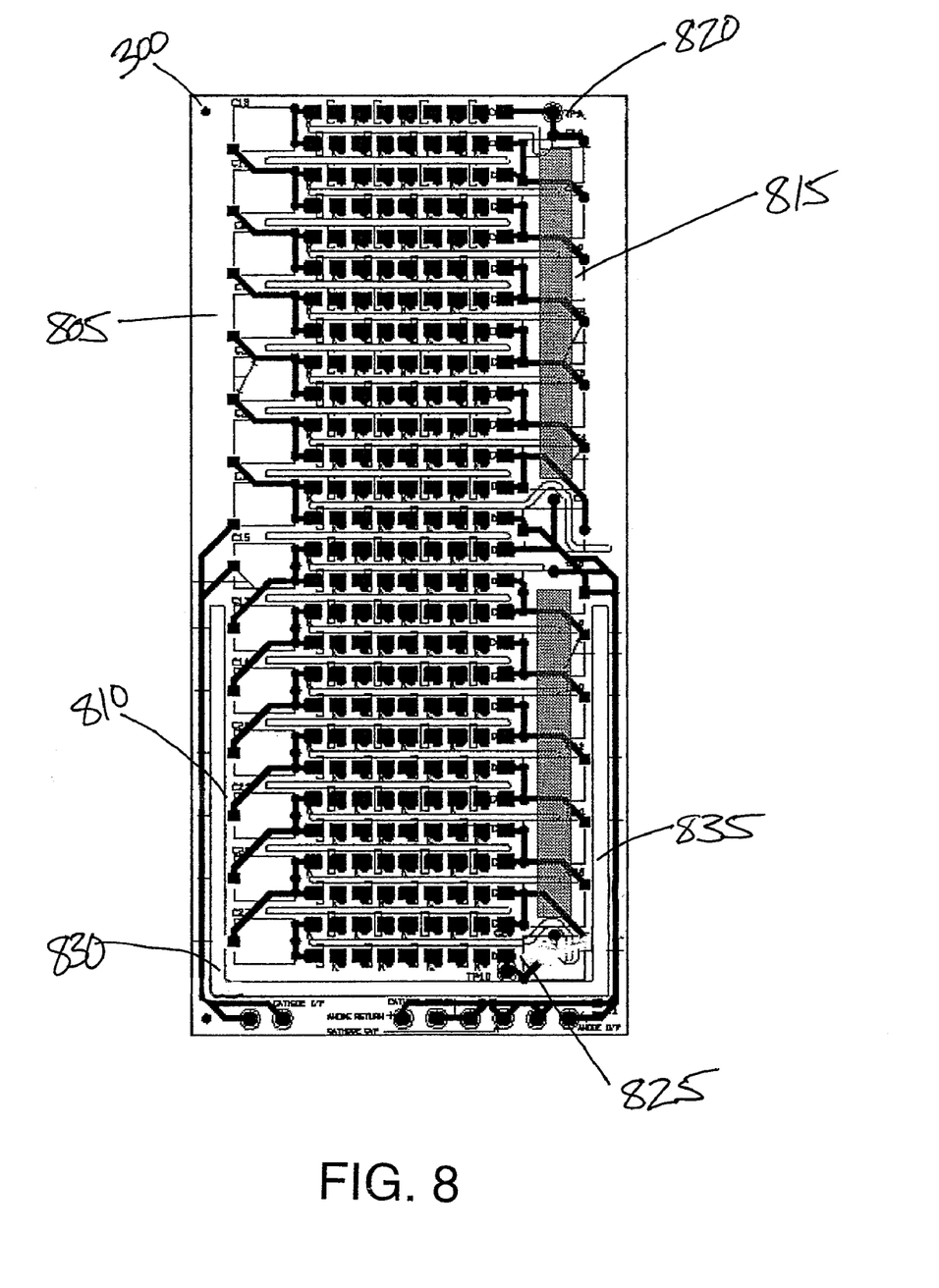
FIG. 8 shows a top view schematic diagram of another embodiment of a printed circuit board.

In another exemplary embodiment, the cathode multiplier and the anode multiplier of the voltage multiplier assembly 130 can be combined into a single printed circuit board. FIG. 8 shows a top view schematic diagram of another embodiment of a printed circuit board 300 that comprises an anode multiplier 805 and a cathode multiplier 810 built-in the printed circuit board 300. This design is an extension to having a design of the anode multiplier 805 and the cathode multiplier 810 on separate printed circuit boards. In this embodiment of the single printed circuit board 300, the output lines from the secondary winding of the high voltage transformer 140 are brought to the center of the printed circuit board 300 by traces in the printed circuit board 300. The anode multiplier 805 and cathode multiplier 810 comprise multiple stages that can be built from the center of the printed circuit board 300.

Further, the design allows mounting of a high voltage transformer 140 and a high voltage component 815 on the printed circuit board 300. An anode output 820 and a cathode output 825 can be connected to the anode 215 and the cathode 210 of the X-ray tube 205. To facilitate the insulation between the high voltage transformer connections and the kV feedback lines, the printed circuit board 300 includes a first slot 830 for insulting the high voltage transformer connections and a second slot 835 for insulating the kV feedback lines.

Figure 9:
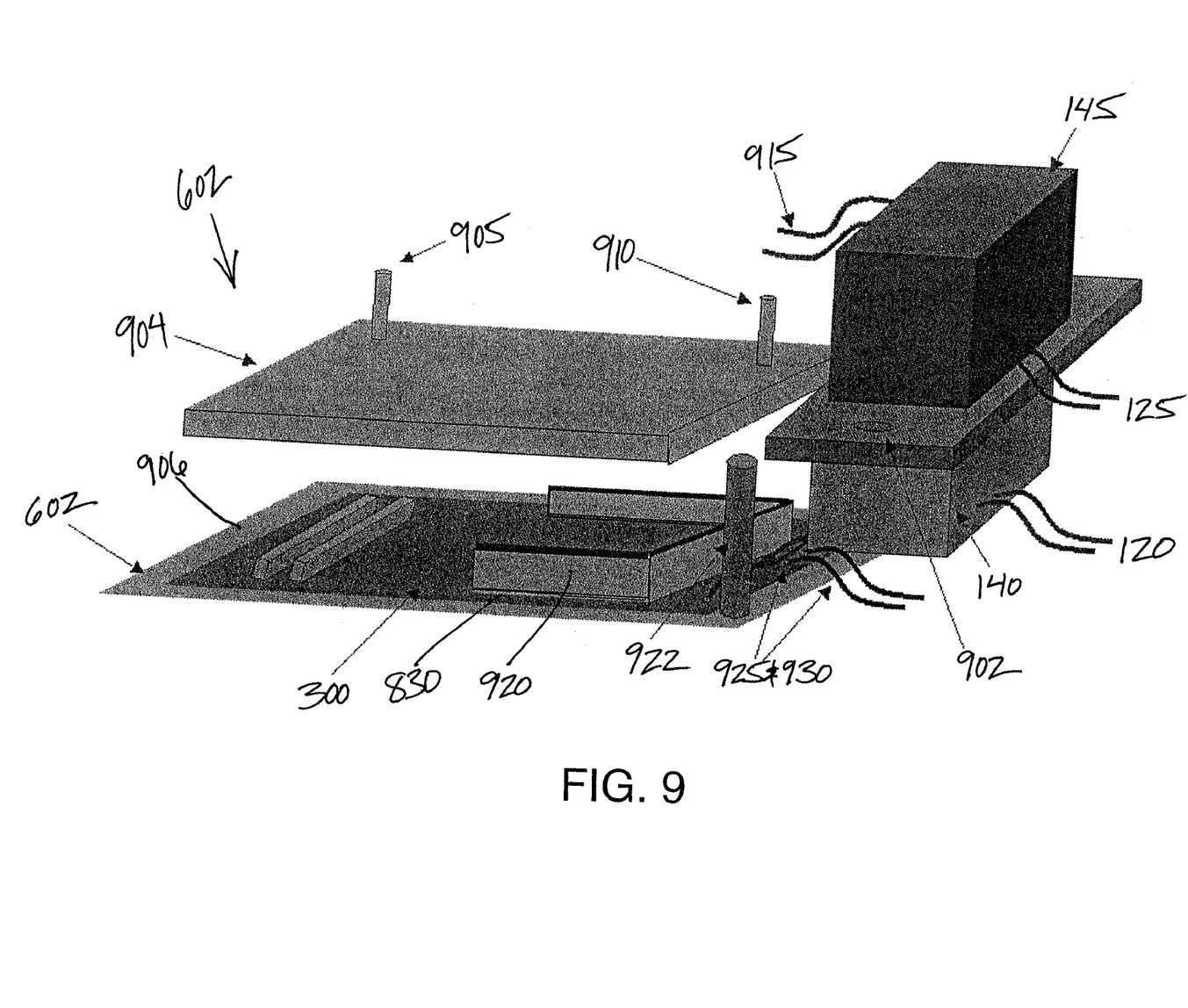
FIG. 9 shows a partially exploded perspective view of a schematic diagram of an embodiment of a high voltage tank assembly.

In an exemplary embodiment, the transformer assembly 135 including the high voltage transformer 140 can be mounted on the printed circuit board 300. FIG. 9 shows a partially exploded perspective view of a schematic diagram of an embodiment of the high voltage tank assembly 110 comprising the transformer assembly 135 mounted on the printed circuit board 300. The printed circuit board 300 may comprise a conduit 922 to facilitate the mounting of the transformer assembly 135 on the printed circuit board 300. The voltage multiplier assembly 130 may further comprise an insulating cover assembly 602. The insulating cover assembly 602 may include a first insulating cover 904 that fits on the outer surface 303 of the first outer layer 305 of the printed circuit board 300 and a second insulating cover 906 that fits on the outer surface 304 of the second outer layer 310 of the printed circuit board 300 thereby enclosing the printed circuit board 300. As shown in FIG. 9, the projections 620 are provided in the second insulating cover 906. One skilled in the art shall however appreciate that the projections 620 can be provided on the first insulating cover 904 as well.

The high voltage tank assembly 110 includes high voltage transformer connections 925 and 930 and the high voltage component 815 that can be separated by a combination of the first slot 830 provided at one end of the printed circuit board 300 and a projection 920 provided at one end of the second insulating cover 906. The transformer assembly 135 can be made compact by placing the filament transformer 145 vertically above the high voltage transformer 140 using a mounting block 902 positioned between two to provide insulation and act as a mounting medium. Further, the insulating cover assembly 602 can be provided with conduits 905 and 910. The conduits 905 and 910 can be configured to connect an output 915 from the filament transformer 145 to the anode 215 and the cathode 210 of the X-ray tube 205. The electrical connection details are as well illustrated in the FIG. 9.

The kV feedback tracks from the high voltage component 815 and the high voltage transformer connection points 925 and 930 are insulated by the provision of an insulation barrier resulting from the combination of slots 830 and 835 in the printed circuit board 300 and projection 920 in the insulating cover assembly 602.

The provision to mount the transformer assembly 135 on the printed circuit board 300 helps in eliminating a high voltage cable used to connect the transformer assembly 135 to the voltage multiplier assembly 130. The elimination of the high voltage cable contributes to the compactness of the high voltage tank assembly 110.

A single unit of the high voltage tank assembly 110 is thereby obtained with a set of two subassemblies, a first subassembly comprising the voltage multiplier assembly 130 and a second subassembly comprising the transformer assembly 135, thereby resulting in a compact and low cost design. A further saving of space and a further reduction in the volume are thus achieved. These reductions are particularly attractive for manufacturing the high voltage tank assemblies in the mobile X-ray systems.

The design of the voltage multiplier assembly provided in various embodiments is a compact and cost effective solution. The number of electrical components used in the voltage multiplier assembly and the space needed for placing the electrical components on the printed circuit board is minimized and made manufacturer friendly. This is made possible by utilizing the printed circuit board for providing electrical connections as well as for regulating the stray capacitance thereby facilitating a high-density packing of the electrical components on the printed circuit board and construction of slots in the printed circuit board and projections in the insulating cover to provide insulation barrier to the electrical components mounted on the printed circuit board.

Placing electrical components on either surface of the printed circuit board as described in various embodiments, enables high-density packaging of electrical components on a printed circuit board, thereby providing a compact design for a voltage multiplier assembly.

As provided in various embodiments, the construction and use of slots in a printed circuit board and projections in an insulating cover assembly provide an insulation barrier to various electrical components mounted on the printed circuit board. Such a construction helps in attaining insulation requirements in the printed circuit board designs and encourages high-density packaging of electrical components on the printed circuit board.

In an exemplary embodiment, the capacitive core element of the printed circuit board can be employed to provide fixed capacitance across one or more electrical components mounted on the printed circuit board. In view of the fact that practically each electrical component in a given printed circuit board requires a fixed capacitor, a very large number of fixed capacitors are required for the voltage multiplier assemblies. The expenditure associated with capacitor purchase, inventory, assembly, and testing, etc., amounts to hundreds of millions of dollars. Considering the component savings, a printed circuit board, which obviates the need for fixed capacitors, is of great value.

In another exemplary embodiment, the cathode multiplier and the anode multiplier are combined into a single printed circuit board to provide the first subassembly, contributing towards making the high voltage tank assembly compact. In another embodiment, the filament transformer is placed vertically above the high voltage transformer with the help of a mounting block to obtain the second subassembly. Further, the two subassemblies namely the first subassembly comprising the voltage multiplier assembly and the second subassembly comprising the transformer assembly are combined to obtain a single unit of the high voltage tank assembly, thereby providing a compact and low cost design.

Further, the placement of the high voltage resistor divider between the capacitor terminals results in definite grading of voltage along the length of the high voltage resistor divider. Moreover, the placement of the high voltage resistor divider between the capacitor terminals results in a compact design for the high voltage tank assembly.

In various embodiments of the invention, a high voltage tank assembly for a radiation generator and a radiation generator using a high voltage tank assembly are described. However, the embodiments are not limited and may be implemented in connection with different applications. The application of the invention can be extended to other areas, for example medical imaging systems, industrial inspection systems, security scanners, particle accelerators, etc. The invention provides a broad concept of designing a voltage multiplier assembly, which can be adapted in a similar power supply system. The design can be carried further and implemented in various forms and specifications.

This written description uses examples to disclose the invention, including the best mode, and also to enable any person skilled in the art to make and use the invention. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A radiation generator comprising:
   an X-ray source;
   a high voltage tank assembly to energize the X-ray source; and
   a power circuit configured to supply AC power to the high voltage tank assembly;

wherein the high voltage tank assembly comprises a voltage multiplier assembly configured to include at least one printed circuit board comprising a plurality of slots extending through the at least one printed circuit board; a plurality of electrical components mounted on the at least one printed circuit board; and at least one separate insulating cover with a plurality of projections configured to fit into and extend through the plurality of slots, the plurality of projections providing insulation barriers between the plurality of electrical components mounted on the at least one printed circuit board.

2. The radiation generator of claim 1, wherein the plurality of electrical components includes a plurality of diodes.

3. The radiation generator of claim 1, wherein the plurality of electrical components includes at least one of a diode, a capacitor and a high voltage resistor.

4. The radiation generator of claim 1, wherein the at least one printed circuit board comprises:
 a first layer;
 a second layer; and
 a capacitive core element disposed in parallel relation between the first layer and the second layer.

5. The radiation generator of claim 4, wherein the high voltage tank assembly further comprises a transformer assembly mounted on the at least one printed circuit board, the transformer assembly comprising a high voltage transformer and a filament transformer, the filament transformer being mounted above the high voltage transformer with a mounting block therebetween.

6. The radiation generator of claim 4, wherein the capacitive core element comprises a plurality of dielectric mediums, each of the plurality of dielectric mediums being separated by at least one electrically conductive plane.

7. The radiation generator of claim 4, further comprising a fixed capacitor across at least one of the plurality of electrical components, wherein the fixed capacitor comprises the capacitive core element.

8. A high voltage tank assembly for an X-ray generator, the high voltage tank assembly comprising:
 a voltage multiplier assembly; and
 a transformer assembly coupled to the voltage multiplier assembly;
 wherein the voltage multiplier assembly comprises:
  a printed circuit board with a plurality of slots extending through the printed circuit board;
  a plurality of electrical components mounted on the printed circuit board; and
  a separate insulating cover placed around the printed circuit board, the separate insulating cover comprising a plurality of projections, the plurality of projections fitting into and extending through the plurality of slots thereby providing insulation barriers between the plurality of electrical components.

9. The high voltage tank assembly of claim 8, wherein the printed circuit board comprises:
 a first layer;
 a second layer; and
 a capacitive core element disposed in parallel relation between the first layer and the second layer.

10. The high voltage tank assembly of claim 9, wherein the plurality of electrical components are mounted on at least one of the first layer and the second layer of the printed circuit board, the plurality of electrical components including a plurality of diodes.

11. The high voltage tank assembly of claim 9, wherein the plurality of electrical components are mounted on at least one of the first layer and the second layer of the printed circuit board, the plurality of electrical components including at least one of a diode, a capacitor and a high voltage resistor.

12. The high voltage tank assembly of claim 9, wherein the capacitive core element comprises a plurality of dielectric mediums, each of the dielectric mediums being separated by at least one electrically conductive plane.

13. The high voltage tank assembly of claim 9, further comprising a fixed capacitor across at least one of the plurality of electrical components, wherein the fixed capacitor comprises the capacitive core element.

14. The high voltage tank assembly of claim 8, wherein the transformer assembly is mounted on the printed circuit board, the transformer assembly comprising a high voltage transformer and a filament transformer, the filament transformer being mounted above the high voltage transformer with a mounting block therebetween.

15. A voltage multiplier assembly for an X-ray generator, the voltage multiplier assembly comprising:
 a printed circuit board comprising:
  a first layer;
  a second layer;
  a plurality of slots extending through the first layer and the second layer; and
  a capacitive core element disposed in parallel relation between the first layer and the second layer;
 a plurality of electrical components configured to be mounted on at least one of the first layer and the second layer of the printed circuit board, the plurality of electrical components including a plurality of diodes; and
 at least one separate insulating cover configured to be placed on one of a first surface and a second surface of the printed circuit board, the at least one separate insulating cover comprising a plurality of projections, the plurality of projections fitting into and extending through the plurality of slots; wherein the plurality of projections provide insulation barriers to the plurality of electrical components, the plurality of projections insulating the plurality of electrical components from each other.

16. The voltage multiplier assembly of claim 15, further comprising a transformer assembly mounted on the printed circuit board, the transformer assembly comprising a high voltage transformer and a filament transformer, the filament transformer being mounted on top of the high voltage transformer with a mounting block therebetween.

17. The voltage multiplier assembly of claim 15, wherein the plurality of electrical components further includes at least one of a capacitor and a high voltage resistor.

18. The voltage multiplier assembly of claim 15, wherein the capacitive core element comprises a plurality of dielectric mediums, each of the plurality of dielectric mediums being separated by at least one electrically conductive plane.

19. The voltage multiplier assembly of claim 15, further comprising a fixed capacitor across at least one of the plurality of electrical components, wherein the fixed capacitor comprises the capacitive core element.

* * * * *